(12) United States Patent
Thompson et al.

(10) Patent No.: US 11,450,191 B2
(45) Date of Patent: Sep. 20, 2022

(54) GROUNDING CABLE WARNING DEVICE

(71) Applicant: Safeguard Equipment, Inc., Post Falls, ID (US)

(72) Inventors: John Wayne Thompson, Coeur d' Alene, ID (US); Brady Hansen, Liberty Lake, WA (US)

(73) Assignee: Safeguard Equipment, Inc., Post Falls, ID (US)

( * ) Notice: Subject to any disclaimer, the term of this patent is extended or adjusted under 35 U.S.C. 154(b) by 126 days.

(21) Appl. No.: 16/945,064

(22) Filed: Jul. 31, 2020

(65) Prior Publication Data
US 2021/0035427 A1 Feb. 4, 2021

Related U.S. Application Data

(60) Provisional application No. 62/881,771, filed on Aug. 1, 2019.

(51) Int. Cl.
*G08B 21/02* (2006.01)
*G08B 7/06* (2006.01)
*G01R 19/165* (2006.01)
(Continued)

(52) U.S. Cl.
CPC ....... *G08B 21/02* (2013.01); *G01R 19/16533* (2013.01); *G01R 31/52* (2020.01);
(Continued)

(58) Field of Classification Search
CPC .... G08B 21/02; G08B 7/06; G01R 19/16533; G01R 19/145; G01R 19/15; G01R 19/155;
(Continued)

(56) References Cited

U.S. PATENT DOCUMENTS 5,565,783 A 10/1996 Lau et al.
5,748,008 A * 5/1998 Landreth .............. G01R 31/008
324/503
(Continued)

OTHER PUBLICATIONS

He, et al., "Research about Alarm System for Grounding Cable Disconnection in High-voltage Cable Grounding System", 2010 China International Conference on Electricity Distribution, retireved on Sep. 29, 2020 from <<https://ieeexplore.ieee.org/stamp/stamp.jsp?p=&arnumber=5735933>>, 8 pages.
The PCT Search Report and Written Opinion dated Nov. 16, 2020 for PCT Application No. PCT/US20/44573, 13 pages.
The International Preliminary Report on Patentability for PCT Application No. PCT/US20/44573, dated Feb. 10, 2022, 11 Pages.

*Primary Examiner* — Brian Wilson
(74) *Attorney, Agent, or Firm* — Lee & Hayes, P.C.

(57) ABSTRACT

A grounding cable warning device includes a housing affixable to a grounding cable. An electrical current transformer is disposed within the housing. An energy storage component is disposed within the housing. A first sensor is disposed within the housing and configured to detect an electrical current in the grounding cable. A second sensor is disposed within the housing and configured to detect a voltage of the grounding cable. One or more electronic indication components are arranged with the housing and configured to alert a user of an unsafe condition. A microcontroller is disposed within the housing and receives input from the first sensor and the sensor and actuates the one or more electronic indication components, in response to receipt of the input, to alert the user of the unsafe condition.

20 Claims, 6 Drawing Sheets

(51) Int. Cl.
*G01R 31/52* (2020.01)
*H02J 7/34* (2006.01)
*H01F 38/28* (2006.01)
*H01F 27/24* (2006.01)

(52) U.S. Cl.
CPC .............. G08B 7/06 (2013.01); *H01F 27/24* (2013.01); *H01F 38/28* (2013.01); *H02J 7/345* (2013.01); *H02J 2207/50* (2020.01)

(58) Field of Classification Search
CPC ....... G01R 19/165; G01R 31/52; H01F 27/24; H01F 38/28; H02J 7/345; H02J 2207/50; H02J 13/00002; H02J 50/001; Y02E 60/00; Y04S 10/30
USPC ...... 340/635, 636.12, 636.13, 636.15, 636.2, 340/641, 657, 660, 661, 662, 664; 324/66, 522
See application file for complete search history.

(56) References Cited

U.S. PATENT DOCUMENTS

| | | | |
|---|---|---|---|
| 10,222,409 B2* | 3/2019 | Tang | G01R 29/18 |
| 2004/0207035 A1 | 10/2004 | Witcraft et al. | |
| 2009/0236012 A1 | 9/2009 | Gass et al. | |
| 2012/0169328 A1* | 7/2012 | Williams | G01R 15/207 |
| | | | 324/251 |
| 2013/0054162 A1 | 2/2013 | Smith et al. | |
| 2013/0197510 A1* | 8/2013 | Heckel | A61B 18/1206 |
| | | | 606/41 |
| 2014/0347037 A1* | 11/2014 | McBee | G01R 21/00 |
| | | | 324/127 |
| 2015/0244165 A1 | 8/2015 | Roesner et al. | |
| 2017/0162320 A1 | 6/2017 | Rumrill | |
| 2017/0184343 A1 | 6/2017 | Freer et al. | |
| 2018/0164350 A1* | 6/2018 | Thompson | G08B 7/06 |

* cited by examiner

GROUNDING CABLE WARNING DEVICE

RELATED APPLICATION

This application claims the benefit of U.S. Provisional Application No. 62/881,771, filed Aug. 1, 2019, entitled "Grounding Cable Warning Device," which is incorporated herein by reference.

BACKGROUND

Technical Field

This disclosure relates to a device affixed to a conductor (e.g., grounding cable). The device may provide a safety warning notification (alert, alarm, warning, etc.) to a user when the device determines there is a relatively excessive amount of electrical current flowing through the conductor. The device may provide a safety warning notification to a user when the device determines there is a relatively excessive amount of voltage present on the conductor. Moreover, the device may provide a safety warning notification when the device determines if the conductor has a relatively high-impedance connection to a ground. The device may further calculate a step-potential estimation based on a ground impedance and an electrical current flowing into the ground. The step-potential may be used to determine if a ground disposed around a grounding-rod is unsafe for a user to maneuver.

DESCRIPTION OF THE RELATED ART

Since the discovery of the ability to harness and manipulate electrical energy, electrical power has been in high-demand worldwide. In some cases, energy industry workers are setting up new power systems to provide power to places not yet connected. In other cases, workers are updating or enhancing established systems, or repairing and/or rebuilding power systems damaged by natural causes and/or accidental events. Yet, still in other cases, workers may be tasked with removing a power system from an area where power is no longer needed or desired. Regardless of the task, energy workers are constantly engaging in activities surrounding power systems that have inherent dangers via which the workers could be harmed.

In some cases, energy industry workers utilize grounding cables for safety when engaging in the activities surrounding power systems. For example, energy industry workers may install one or more grounding cables as part of a personal protective grounding circuit. Typically, these grounding cables are installed on circuits (e.g., power lines) that have been disconnected from known sources of system energization. However, even though a line may have been disconnected from known sources of system energization, unanticipated sources of energization and/or electromagnetic fields from nearby energized circuits can produce electrical current flows within the isolated circuit. Thus, electrical current flows through the grounding cables may develop therein as induced electrical current flows. Induced electrical current flows and voltages may vary as electromagnetic fields of adjacent circuits vary with loading on the adjacent circuits. The induced electrical current flows and voltages may range from relatively safe to extremely lethal through a course of a single work shift.

The electrical current flows within these isolated circuits can result in safety problems. In one example, an energy industry worker may be unaware of a electrical current flow within an isolated circuit and inadvertently be in series with the electrical current flow. In another example, the electrical current flow may flow through a resistance that creates a voltage drop that leads to a hazardous difference in potential. In another example, the electrical current flow may flow through a grounding cable that exceeds a continuous electrical current carry capacity of the grounding cable and cause the grounding cable to fail (e.g., fusing). In another example, the electrical current flow may flow through a cable and into a grounding rod, steel structure, or other conductive elements that create elevated worksite step and touch potential hazards.

Accordingly, there remains a desire to provide energy industry workers with real time insight into electrical current flow within personal protective grounding circuits.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Overview

Figure 1:
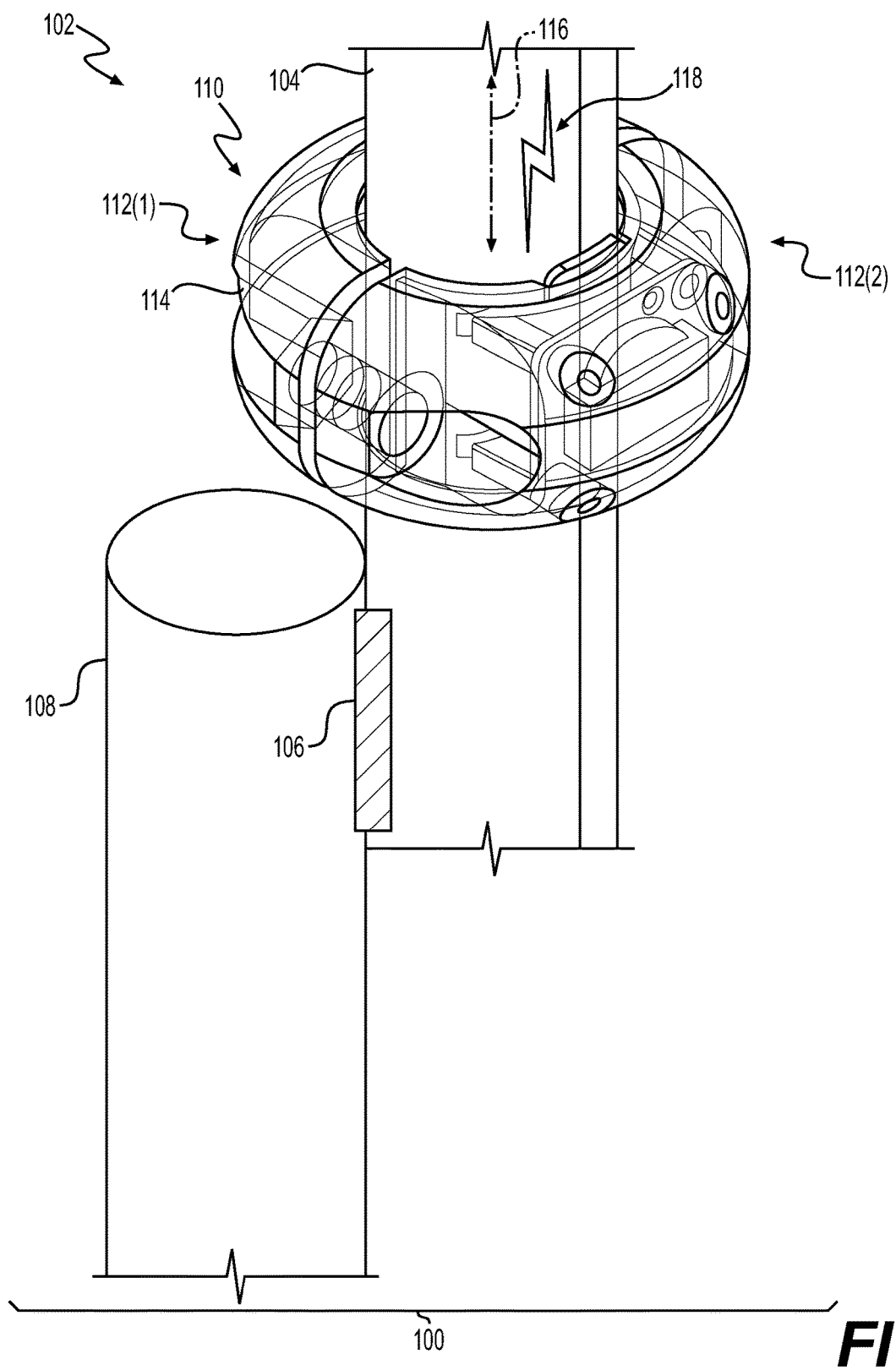
FIG. 1 illustrates perspective view of a grounding cable warning system according to an embodiment of this disclosure.

The following disclosure describes various features and concepts for implementation in a grounding cable warning device. That is, while the disclosure describes "a" or "the" grounding cable warning device, the article (e.g., "a," "an," or "the") used preceding "grounding cable warning device" is not intended to indicate a limitation of the features of the device itself, unless otherwise so stated. Indeed, multiple embodiments of a grounding cable warning device may be possible by using one or more of the various features and concepts in varying implementations and/or combinations. For example, while the figures may depict an embodiment of a grounding cable warning device affixed to a grounding cable, it is contemplated that one or more features and concepts described herein as related to the grounding cable warning device may be implemented in other embodiments, such as, for example, an embodiment of the features for affixing to a ground, a steel structure, or other conductive elements and configured to provide a safety warning notification (alert, alarm, warning, etc.) to a user of potential unsafe electrical current risk and/or unsafe impedance risk.

A grounding cable warning device as disclosed herein may have a primary function of detecting nearby energized conductors and alerting users to the presence thereof via one or more sensory notifications. Such notifications are issued with the intent to reduce the occurrence of injuries due to electrocution. This goal may be realized when the grounding cable warning device is used in an environment where unanticipated sources of energization and/or electromagnetic fields from nearby energized circuits may produce electrical current flows within conductors (e.g., isolated circuits). Thus, a grounding cable warning device may greatly benefit utility linemen, electricians, disaster relief personnel, etc.

In an embodiment, a grounding cable warning device may be affixed to a grounding cable, which may provide advantages in detecting an electrical current in the grounding cable and/or a voltage of the grounding cable due to relative proximity to the grounding cable. While this embodiment may be affixed to a grounding cable, it is contemplated that the grounding cable warning device may be structured in other configurations (different than shown) with different connection means (not shown), which may be more compatible with securing to other conductors (not shown) other than a grounding cable of a grounding system. In such alternative embodiments, it is contemplated that features and processes executed by the grounding cable warning device may be the same or similar to those described herein. Moreover, it is also understood that in such alternative structural configurations, that the processes described herein may be modified compared to those described herein below to compensate for the change in structure and/or difference in relative mounting, etc. Thus, a grounding cable warning device may be formed in other structural embodiments including, but not limited to, a structure configured to be affixed to a steel structure or other conductor (not shown). It further follows that the arrangement and orientation of internal components in a steel structure embodiment may be altered from the description herein to adjust for differences that may exist in the manner of detection according to a configuration of a steel structure or other conductor.

Regardless of structural configuration, in an embodiment, a grounding cable warning device may include an energy storage component and an electrical current transformer that may charge the energy storage component. The grounding cable warning device may further include a first sensor configured to detect an electrical current in a conductor and a second sensor configured to detect a voltage of the conductor.

Additionally, the grounding cable warning device may include one or more additional sensors. For example, the grounding cable warning device may include one or more additional voltage sensors on either side of a wire to measure a voltage of the wire while ignoring an electric field created from a power system proximate to the grounding cable. The grounding cable warning device may provide for selectively measuring a current and a voltage in the grounding cable regardless of other power systems generating electric and magnetic fields proximate to the grounding cable.

The grounding cable warning device may further include a microcontroller configured to receive input from the first sensor and the second sensor and actuate one or more alarms to alert a user of an unsafe condition. Additionally, a radio may be included to communicate information to a wireless platform. Thus, the grounding cable warning device may enhance safety in a work environment and assist a worker when working around high-voltage equipment.

The grounding cable warning device may use any combination of visual, auditory, tactile notifications, and mobile phone notifications, to alert the user when approaching and/or entering a particular proximity of an energized conductor.

In an embodiment, the grounding cable warning device may provide feedback to users via one or more communication channels. The one or more communication channels may be a numerical display, a system of warning lights, an audible alarm, a remote display device connected via a wireless communication path, information delivered to a cloud application, connected computers, mobile communication devices such as phones and/or tablets.

Additionally, in an embodiment, the grounding cable warning device may record on memory, built into the grounding cable warning device, data regarding the use of the grounding cable warning device. Such data may include, but is not limited to: specific induced voltages and electrical currents for specific locations and circuits, impedance of personal protective grounding circuits and components, health of grounding cables, induced electrical currents during specific circuit conditions, etc. This data may be collected and organized by the grounding cable warning device and/or by a receiving device intended to receive the data. The data may be transferred via a wired or wireless transfer to the receiving device. The data may further be analyzed by the receiving device and/or the data may be further transferred to a server for further and/or additional analysis. The data may include information to analyze work-place safety metrics to evaluate the safety practices of workers. Examples of possible receiving devices may include a cell phone, tablet, laptop, desktop computer, or any other electronic device capable of receiving the data. Furthermore, the grounding cable warning device may be equipped with a hardwire connection and/or wireless data transfer hardware and/or software in order to transfer the data out of the grounding cable warning device, at which point the memory may be wiped and reset to store additional data. In an embodiment, the grounding cable warning device may use Bluetooth® technology to transfer the data from the grounding cable warning device to a receiving device constantly or intermittently.

Illustrative Embodiments of a Grounding Cable Warning Device

FIG. 1 illustrates a perspective view 100 of a grounding cable warning system 102 according to an embodiment of this disclosure. The grounding cable warning system 102 may include a grounding cable 104 having a connection 106 with a grounding member 108. The grounding cable 104 may be connected to a circuit that has been disconnected from a known source of system energization. For example, the grounding cable 104 may be connected to a powerline that has been disconnected from a power provider. The grounding cable 104 may be connected to a circuit that has been disconnected from a known source of system energization to provide safety for industrial workers engaged in activities surrounding power systems. The grounding member 108 may be a grounding rod (e.g., conductive rod) driven into the ground. The connection 106 between the grounding cable 104 and the grounding member 108 may be produced via a mechanical fastener (e.g., a clamp, a U-bolt, a wrap, etc.).

The grounding cable warning system 102 may include a grounding cable warning device 110. The grounding cable warning device 110 may be affixed to the grounding cable 104. For example, the grounding cable warning device 110 may include a first member 112(1) and a second member 112(2) that couple together and clamp to the grounding cable 104. In another example, the grounding cable warning device 110 may slideably receive the grounding cable 104. Furthermore, the grounding cable warning device 110 may be permanently affixed to the grounding cable 104.

The grounding cable warning device 110 may include a housing 114. The first member 112(1) may include a first portion of the housing 114, and the second member 112(2) may include a second portion of the housing 114. An electrical current transformer may be disposed within the housing 114. The electrical current transformer may be a power-harvesting split-core electrical current transformer. The power-harvesting split-core electrical current transformer (CT) may charge an energy storage component disposed within the housing 114.

As noted above, the grounding cable warning system may include one or more sensors and one or more of each sensor described herein. For example, a first sensor may be disposed within the housing 114. The first sensor may be configured to detect an electrical current 116 in the grounding cable 104. The electrical current 116 may be an induced electrical current. For example, the electrical current 116 may be induced from unanticipated sources of energization and/or electromagnetic fields from nearby energized circuits. The first sensor may comprise a magneto-resistive integrated circuit (IC) disposed within the housing 114 and configured to detect the electrical current 116 in the grounding cable 104. The grounding cable warning device 110 may use the electrical current transformer and the first sensor to sense the electrical current 116 in the grounding cable 104.

A second sensor may be disposed within the housing 114 and configured to detect a voltage 118. The second sensor may include an electric field sensor disposed within the housing 114 and configured to detect the voltage 118 of the grounding cable 104. The electric field sensor may include a capacitively-coupled PCB parallel-plate antenna, a tri-parallel-plate capacitive electric field antenna, or a capacitively-coupled PCB pad array antenna in which small amounts of electrical current are pushed back and forth between electrical surfaces due to an external electric field. A pico-ampere current measurement circuit may be placed between electrical surfaces to measure this charge oscillation and related to an external electric field. (discussed in more detail below with regard to FIG. 3).

One or more electronic indication components may be arranged with the housing 114 and configured to alert a user of an unsafe condition. The one or more electronic indication components may include a light source arranged with the housing 114 to produce a visual alert of the unsafe condition, a speaker arranged with the housing to produce an audible alert of the unsafe condition, and/or an antenna arranged with the housing to produce a signal of the unsafe condition.

A microcontroller may be disposed within the housing 114. The microcontroller may be configured to receive input from the first sensor and the second sensor. The microcontroller may actuate the one or more alarms, in response to receipt of the input, to alert the user of the unsafe condition.

Figure 2:
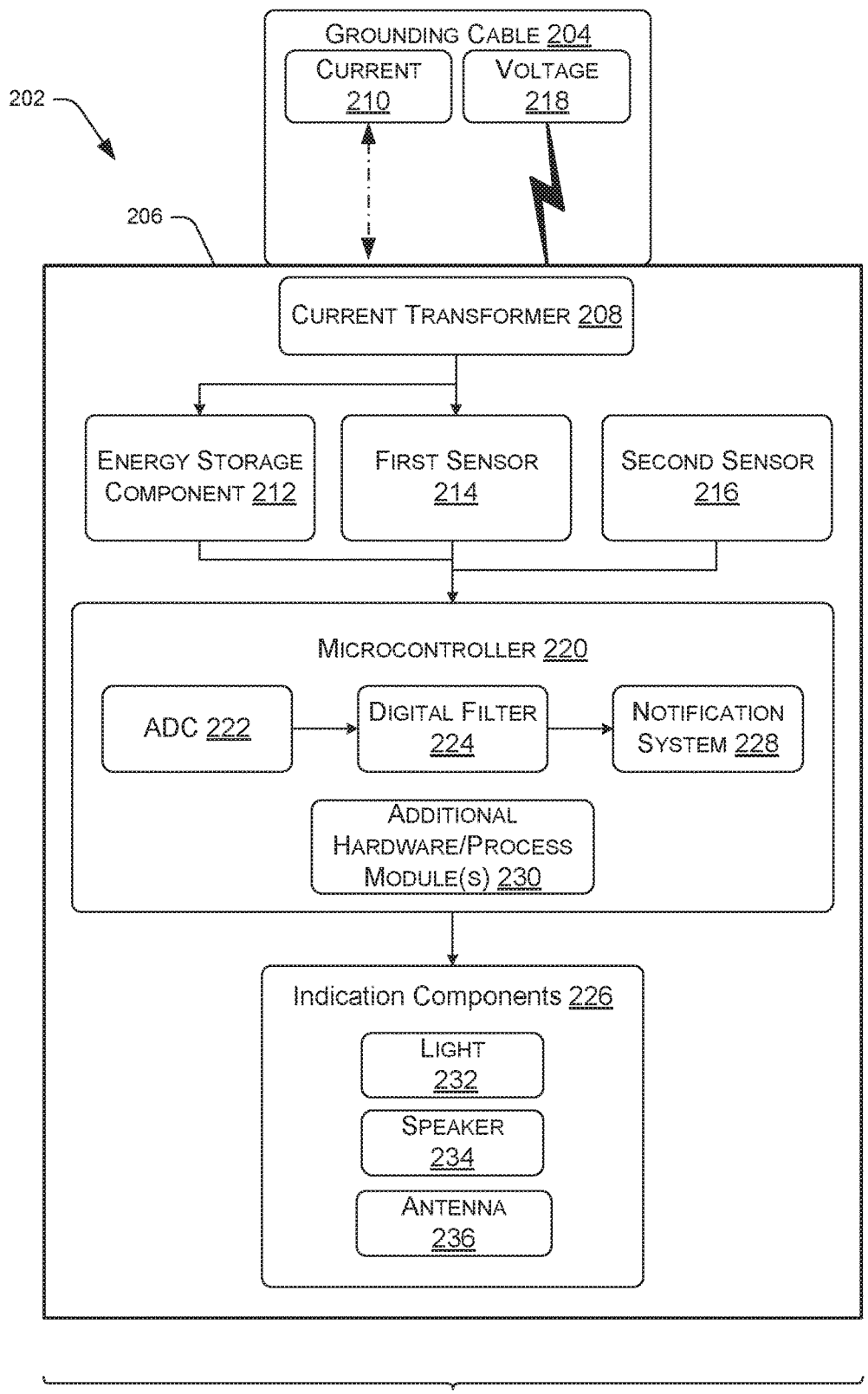
FIG. 2 illustrates a schematic view of a grounding cable warning device according to an embodiment of the instant disclosure.

FIG. 2 illustrates a schematic view 200 of a grounding cable warning device 202 according to an embodiment of the instant disclosure. The grounding cable warning device 202 may be the same as the grounding cable warning device 110 illustrated in FIG. 1. The grounding cable warning device 202 may be affixed to a grounding cable 204. The grounding cable 204 may be the same as grounding cable 104 illustrated in FIG. 1. The grounding cable warning device 202 may include a housing 206. Housing 206 may be the same as housing 114 illustrated in FIG. 1.

An electrical current transformer 208 may be disposed in the housing 206. If an electrical current 210 flowing through the grounding cable 204 is of a sufficient amount, the electrical current transformer 208 may charge an energy storage component 212 disposed in the housing 206. For example, if the electrical current 210 flowing through the grounding cable 204 is greater than about two Amperes, then the electrical current transformer 208 may charge the energy storage component 212. The electrical current transformer 208 may be a power-harvesting split-core electrical current transformer. The electrical current transformer 208 may selectively measure the current in the ground cable. The electrical current transformer 208 may not measure an ambient magnetic field. The energy storage component 212 may be a rechargeable battery (e.g., a rechargeable lithium-ion polymer battery or a rechargeable lithium-ion polymer battery pack) or a capacitor (e.g., high-capacity capacitor, supercapacitor, etc.). A power connection may be disposed in the housing 206. The power connection may provide for recharging the energy storage component 212. The power connection may be a Universal Serial Bus (USB), a mini USB, a micro USB, a coaxial power connector, etc.

A first sensor 214 may be disposed within the housing 206. The first sensor 214 may be configured to detect the electrical current 210 in the grounding cable 204. The first sensor 214 may selectively measure the ambient AC magnetic field and the DC magnetic field. The first sensor 214 may detect the electrical current 210 via the electrical current transformer 208. The first sensor 214 may comprise a magneto-resistive integrated circuit (IC). The first sensor 214 may detect very small magnetic fields. The current transform 208 may detect medium-scale electrical current. The first sensor 214 may detect magnetic field orienting from a wire and/or other sources around a ground cable. The current transformer 208 will only detect current flowing in the grounding cable. The first sensor 214 may provide information useable to predict future induced electric current values. For example, the first sensor 214 may provide information identifying an increasing ambient magnetic field useable to predict an expected increase of the induced electrical current. The first sensor 214 may provide for detecting direct current (DC) magnetic fields for DC electric current. Because the current transformer 214 may detect alternating current (AC) magnetic fields, but not DC magnetic fields, the current transformer 214 may become saturated and may fail to operate correctly. The first sensor 214 may provide for detecting the DC current and may provide a warning of the current transformer 214 potential failure/derating.

A second sensor 216 may be disposed within the housing 206. The second sensor 216 may be configured to detect a voltage 218 of the grounding cable 204. The second sensor 216 may selectively measure the voltage of the ground cable. The second sensor 216 may include one or more conductive shields. The second sensor 216 may utilize the one or more conductive shields to block exterior electric fields generated by nearby power systems. The second sensor 216 may utilize the one or more conductive shields to block electric fields of the grounding cable, but not block (e.g., remain open to) electric fields of nearby power systems. The second sensor 216 may comprise an electric field sensor. The electric field sensor may include a capacitively-coupled PCB parallel-plate antenna, a tri-parallel-plate capacitive electric field antenna, or a capacitively-coupled PCB pad array antenna (discussed in more detail below with regard to FIG. 3).

A microcontroller 220 (e.g., CPU) may be disposed within the housing 206 and configured to receive input from the first sensor 214 and receive input from the second sensor 216. For example, the microcontroller 220 may receive a first input indicating an electrical current value, indicative of the electrical current 210, from the first sensor 214, and may receive a second input indicating a voltage value, indicative of the voltage 218, from the second sensor 216. The microcontroller 220 may receive power from the energy storage component 212.

The microcontroller 220 may calculate an impedance value of a connection (e.g., connection 106 discussed above with regard to FIG. 1). The impedance value may be based at least in part on the electrical current value and the voltage value. For example, the microcontroller 220 may calculate the impedance value of a connection between the grounding cable 204 and a grounding member (e.g., ground member 108) using the formula Z=V/I, where "Z" is equal to the impedance value, "V" is equal to voltage value, and "I" is equal to electrical current value.

The microcontroller 220 may process the inputs received from the first sensor and/or the second sensor via an analog-to-digital converter 222 ("ADC"). The converted digital inputs may then be further processed via a digital filter 224. Once filtered, the microcontroller 220 determines whether to actuate one or more electronic indication components 226 via notification system 228.

The notification system 228 may compare the digital inputs to a predetermined threshold digital input. For example, the notification system 228 may compare the digital input representing the electrical current value received from the first sensor 214 to a predetermined threshold digital input representing an acceptable threshold value of electrical current. As another example, the notification system 228 may compare the digital input representing the approximate voltage value received from the second sensor 216 to a predetermined threshold digital input representing an acceptable threshold value of voltage. As another example, the notification system 228 may compare a digital input representing the calculated impedance value to a predetermined threshold digital input representing an acceptable threshold value of impedance. The microcontroller 220 may process the digital inputs with historical measurements of the electrical current values, the voltage values, and/or the impedance values. Additional hardware and/or process modules 230 such as memory, may be implemented to assist the functions of microcontroller 220.

Upon a determination that a warning notification should be initiated, microcontroller 220 may execute an operation to cause the one or more electronic indication component(s) 226 to begin a warning notification. For example, the one or more electronic indication component(s) 226 may include, but are not limited to: one or more light source(s) (e.g., one or more LEDs) 232, one or more speaker(s) 234, and/or one or more antenna 236. The one or more light source(s) 232 may be arranged with the housing 206 to produce a visual alert of the unsafe condition. The one or more speaker(s) 234 may be arranged with the housing 206 to produce an audible alert of the unsafe condition. The one or more speakers may include a variety of speakers, such as for example, a piezoelectric speaker. The antenna may be arranged with the housing to produce a signal of the unsafe condition. For example, the signal produced by the antenna may provide for a phone alert. Moreover, the signal produced by the antenna may provide for providing feedback to workers via a numerical display, a remote display device connected via a wireless communication path and/or information delivered to a cloud application and/or connected computers and/or mobile communication devices such as phones and/or tablets.

Figure 3A:
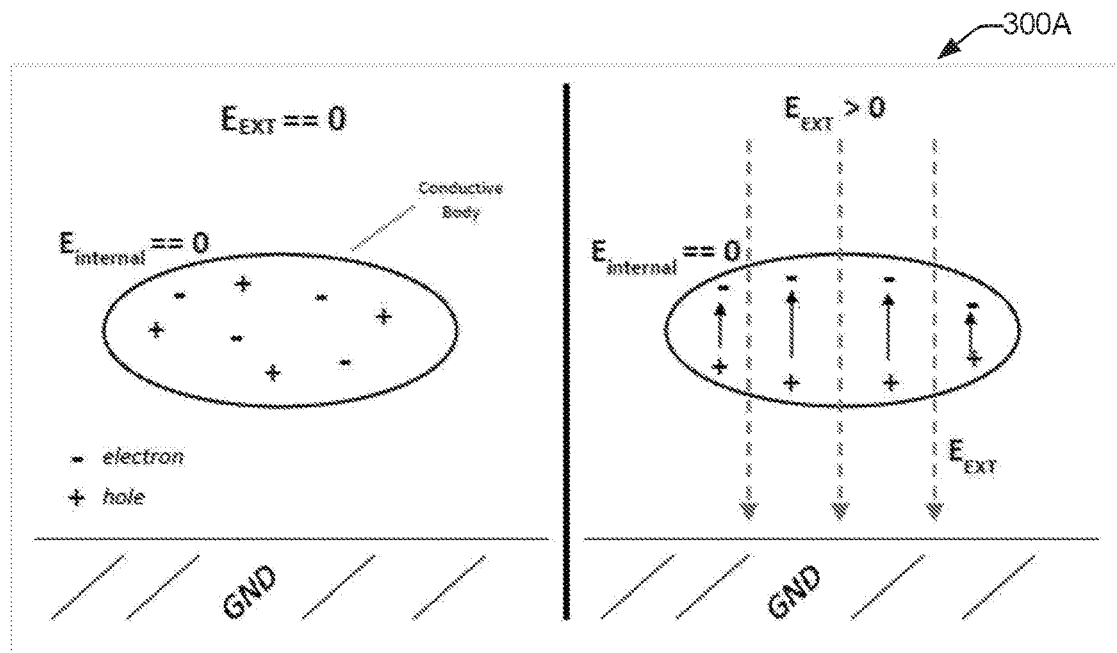
FIG. 3A illustrates a representation of an electric field inside of a conductor, a representation of the conductor split in half, and a circuit according to the instant disclosure.
Figure 3A:
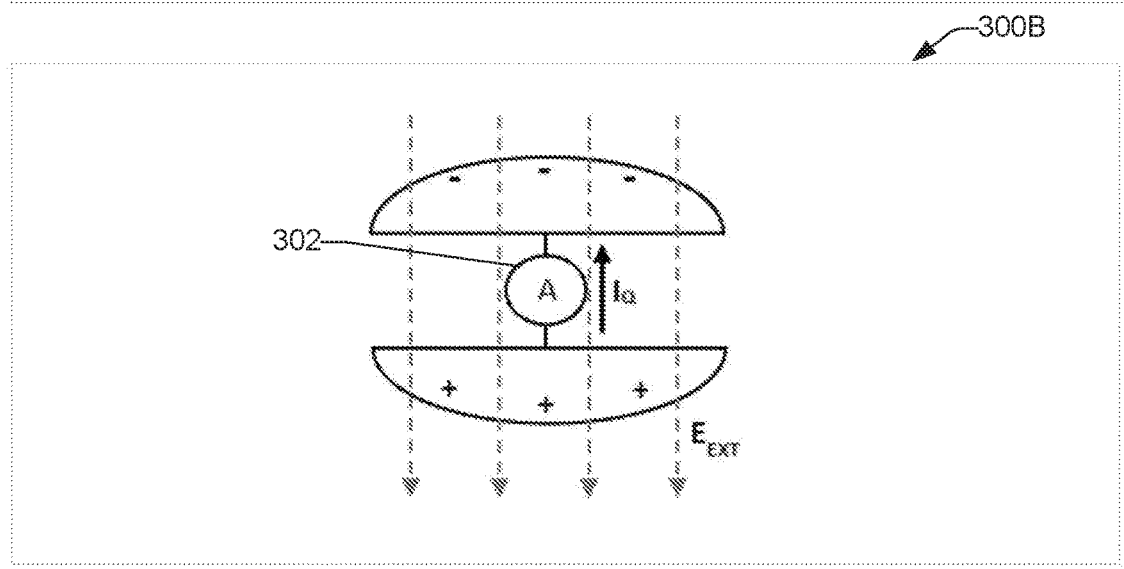
Figure 3A:
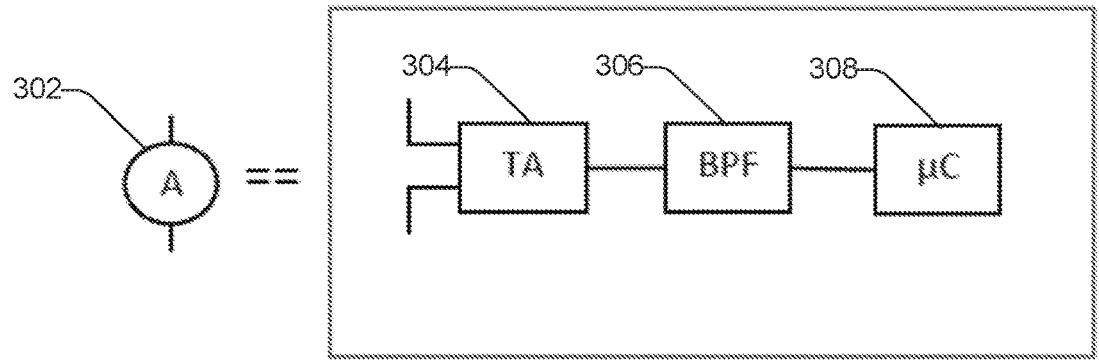

Illustrative Embodiments of a Second Sensor for a Grounding Cable Warning Device FIG. 3A illustrates a representation 300A of an electric field inside a conductor ($E_{int}$), a representation 300B of the conductor split in half, and a circuit 302 that may be used to measure a charge. The representation 300A depicts the electric field inside the conductor ($E_{int}$) is always zero. Electrons (-) are free to move in conductors and external electric fields ($E_{ext}$) apply a force on charges (electrons) in a conductive body. When a conductive body is placed inside an external electric field, the charges (electrons) experience a force and are moved (redistributed) until the resultant electric field inside the conductor is zero. The representation 300B depicts a charge movement in the conductive body is electrical current ($I_Q$) and can be measured if the conductor is split in half, then shorted together through the circuit 302. The circuit 302 may be a sensitive current measurement circuit. The circuit 302 may be a pico-Ammeter as the electrical charge moving inside a conductor due to an external electric field is very small, in the range of about $1\times10^{-12}$ Amperes. The circuit 302 may include a first stage Transimpedance amplifier (TA) 304 and a second stage bandpass filter (BPF) 306. The resultant small-signal voltage may be fed to a microcontroller (μC) 308. The microcontroller (μC) 308 may be the same as the microcontroller 220.

Figure 3B:
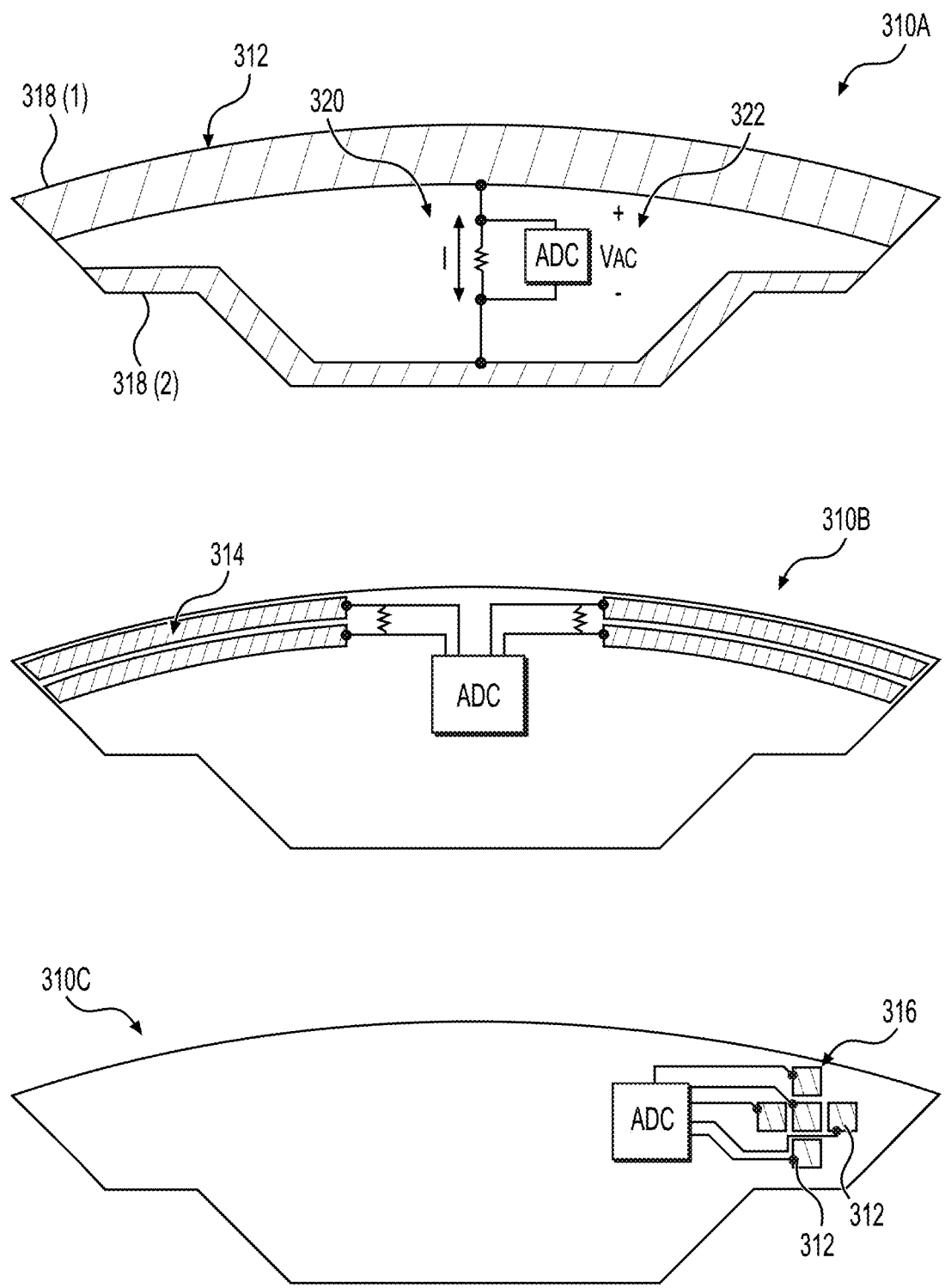
FIG. 3B illustrates variations of embodiments of electric field sensors according to the instant disclosure.

FIG. 3B illustrates three variations of second sensor (e.g., second sensor 216) configurations 310A, 310B, and 310C that may be used as electric field sensors in a grounding cable warning device. Configuration 310A depicts a sensor 312, which is a capacitively-coupled PCB parallel-plate antenna. Configuration 310B depicts an embodiment of a sensor 314 of a tri-parallel-plate capacitive electric field antenna. Configuration 310C depicts an embodiment of a sensor 316 of a capacitively-coupled PCB pad array antenna.

Sensor 312 shown in configuration 310A is a single directionally-tuned PCB capacitive antenna. In an embodiment, sensor 312 may include two PCB conductive parallel-plates 318(1), 318(2) that are shorted through an impedance 320. An AC electric field excites charge to be re-distributed back-and-fourth on the conductive parallel-plates 318(1), 318(2), traveling through the shorted impedance 320. The charge flowing through the impedance 320 may generate a measurable AC voltage 322, which corresponds to the measured electric field. Additionally, a pico-ampere electrical current measurement circuit may be placed in series with the two conductive parallel-plates 318(1), 318(2) to measure the small electrical current which is oscillating back and forth. For example, the circuit 302 may be placed in series with the two conductive parallel plates 318(1), 318(2) to measure the small electrical current which is oscillating back and forth. Sensor 312 yields a maximum measured AC voltage 320 when the parallel-plates 318(1), 318(2) are oriented perpendicularly to electric field lines.

In an alternative embodiment, a grounding cable warning device may include sensor 314 of configuration 310B of a tri-parallel-plate capacitive electric field antenna. In contrast to sensor 312, sensor 314 implements three capacitively-coupled PCB parallel-plate antennas, each of which functions similarly as described with respect to sensor 312 above. Furthermore, as illustrated in FIG. 3B, by orienting each of a set of three parallel-plate antennas perpendicularly to each other, regardless of the emanating direction, at least one of the parallel-plate antennas may detect a nearby electric field, as the electric field cannot be parallel with all three antennas at the same time.

In another alternative embodiment, a grounding cable warning device may implement configuration 310C with sensor 316. As stated above, sensor 316 may include a capacitively-coupled PCB pad array antenna, which uses a plurality of arranged pads 324 instead of parallel-plates. In sensor 316, the current moving between the array of pads 324 may determine the electric fields.

Figure 4:
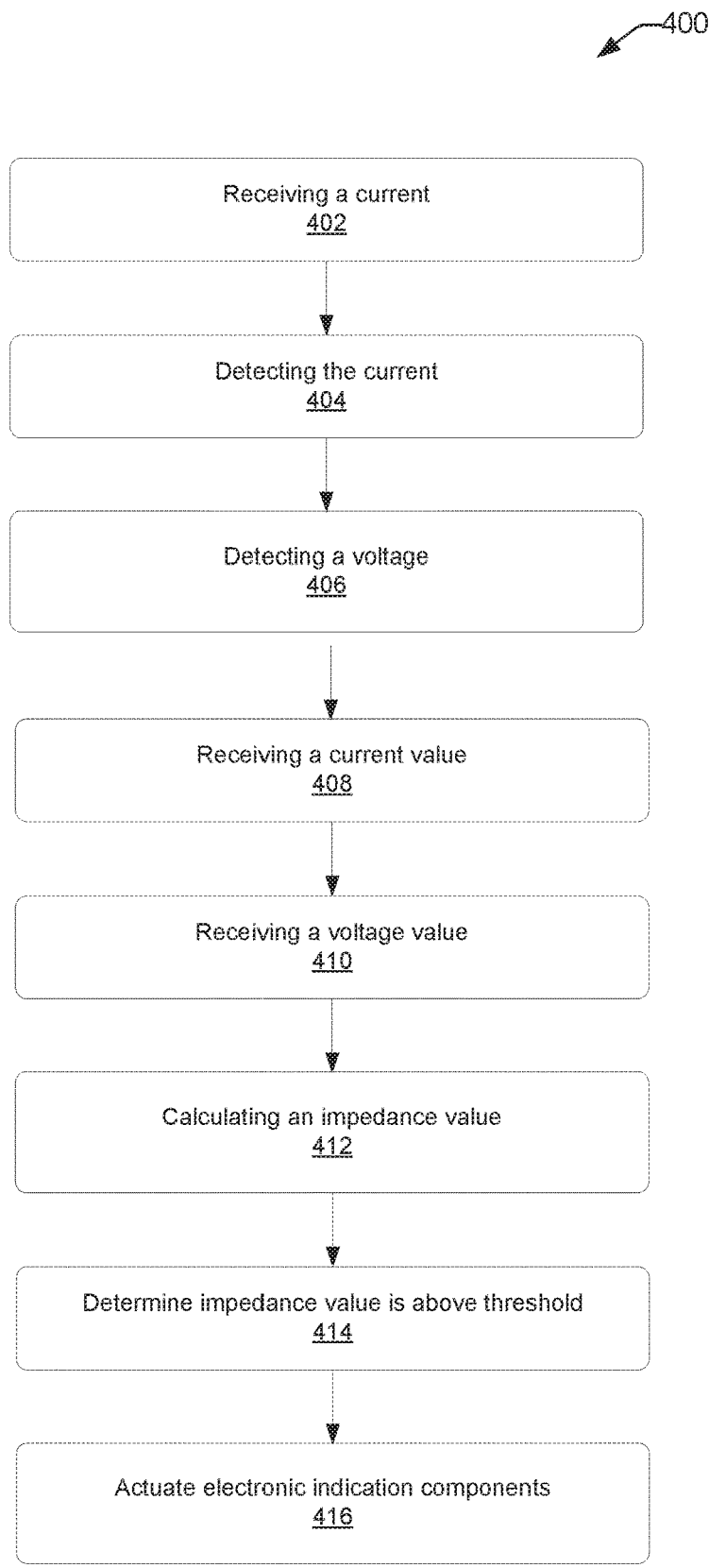
FIG. 4 illustrates an example method of providing a safety warning using a grounding cable warning device affixed to the grounding cable according to the instant disclosure.

Illustrative Embodiment of a Method of Providing a Safety Warning Using the Grounding Cable Warning Device FIG. 4, illustrates an example method 400 of providing a safety warning using a grounding cable warning device affixed to a grounding cable. For instance, this process may be performed to provide a safety warning notification (alert, alarm, warning, etc.) to a user when the grounding cable warning device (e.g., grounding cable warning device 110 or 202) determines there is a relatively excessive amount of electrical current flowing through the grounding cable (e.g., grounding cable 104 or 204). This process may be performed to provide a safety warning notification to a user when the grounding cable warning device determines there is a relatively excessive amount of energy flowing through the conductor. Moreover, this process may be performed to provide a safety warning notification to a user when the grounding cable warning device determines if the grounding cable has a relatively high-impedance connection to a ground. Further, this process may be performed to determine a step-potential estimation based on a ground impedance and an electrical current flowing into the ground. While FIG. 4 illustrates a method of using an example grounding cable warning device affixed to a grounding cable, this method may apply to using the grounding cable warning device affixed to any other type of conductor. For example, the grounding cable warning device may be affixed to a steel structure, or other conductive elements.

Method 400 may include operation 402, which represents receiving, by an electrical current transformer (e.g., electrical current transformer 208) disposed within a housing (e.g., housing 114 or 206) of the grounding cable warning device, an electrical current of the grounding cable. Operation 402 may further represent the electrical current transformer charging an energy storage component (e.g., energy storage component 212) disposed within the housing.

Method 400 may proceed to operation 404, which represents detecting, by a first sensor (e.g., first sensor 214) disposed within the housing, the electrical current of the grounding cable. Method 400 may include operation 406, which represents detecting a voltage of the ground cable, by a second sensor (e.g., second sensor 216) disposed within the housing.

Method 400 may continue with operation 408, which represents receiving, by a microcontroller (e.g., microcontroller 220) disposed within the housing and from the first sensor, a first input indicating an electrical current value of the electrical current as detected by a magneto-resistive IC. Operation 408 may include comparing a digital input representing the electrical current value received from the first sensor to a predetermined threshold digital input representing an acceptable threshold value of electrical current. Method 400 may continue with operation 410, which represents receiving, by the microcontroller and from the second sensor, a second input indicating a voltage value of the voltage. Operation 410 may include comparing a digital input representing the voltage value received from the second sensor to a predetermined threshold digital input representing an acceptable threshold value of voltage.

Method 400 may include operation 412, which represents calculating, by the microcontroller, an impedance value of a connection between the grounding cable and a grounding member (e.g., grounding member 108), the impedance value based at least in part on the electrical current value and the voltage value. Method 400 may continue with operation 414, which represents determining, by the microcontroller, the impedance value is above a threshold impedance value.

Method 400 may be complete at operation 416, which represents actuating, by the microcontroller in response to receiving the first input and the second input, one or more electronic indication components (e.g., one or more electronic indication components 226) to alert the user of the unsafe condition. The device may also respond to received inputs and using electric indication components to inform the user of information which may not relate to the safety of the condition.

Figure 5:
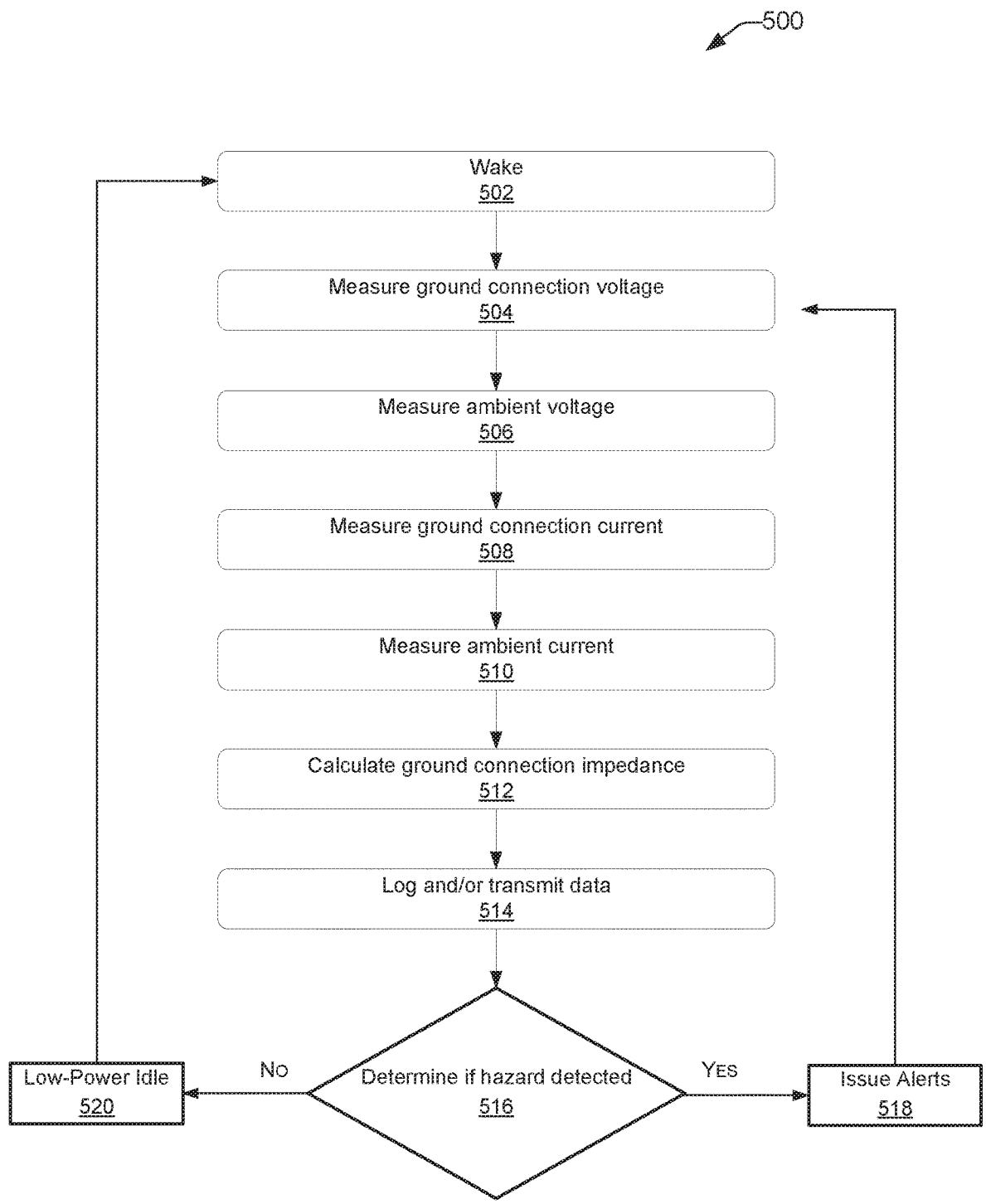
FIG. 5 illustrates an example method of providing a safety warning using grounding cable warning software associated with a grounding cable warning device according to the instant disclosure.

Illustrative Embodiment of a Method of Providing a Safety Warning Using Grounding Cable Warning Software associated with the Grounding Cable Warning Device FIG. 5 illustrates an example method 500 of providing a safety warning using grounding cable warning software associated with a grounding cable warning device. The method 500 may be, but is not necessarily, implemented using a grounding cable warning device (e.g., grounding cable warning device 110 or 202). For instance, a grounding cable warning device may be affixed to a grounding cable (e.g., grounding cable 104 or 204), and grounding cable warning software may cause a microcontroller (e.g., microcontroller 220) disposed within a housing (e.g., housing 206) of the grounding cable warning device to implement the method 500. This process may be performed to provide a safety warning notification (e.g., alert, alarm, warning, etc.) to a user when the grounding cable warning device determines there is a relatively excessive amount of electrical current flowing through the grounding cable, where the term "relatively" (as used here and hereinafter) is defined with respect to the normative properties expected or intended for the particular grounding cable. Further, this process may be performed to provide a safety warning notification to a user when the grounding cable warning software implemented in the grounding cable warning device is executed and, a result of the execution thereof is a determination that there is a relatively excessive amount of energy flowing through the conductor. Moreover, this process may be performed to provide a safety warning notification to a user when the grounding cable warning software implemented in the grounding cable warning device is executed and, a result of the execution thereof is a determination that the grounding cable has a relatively high-impedance connection to a ground. Further, this process may be performed to determine a step-potential estimation based on a ground impedance and an electrical current flowing into the ground. While FIG. 5 illustrates a method of using grounding cable warning software associated with an example grounding cable warning device affixed to a grounding cable, this method may apply to using grounding cable warning software associated with a grounding cable warning device affixed to any other type of conductor. For example, the grounding cable warning device may be affixed to a steel structure, or other conductive elements.

Method 500 may include operation 502, which represents a wake mode. For example, the grounding cable warning software may cause the grounding cable warning device to wake from a low-power idle period of time ($T_{idle}$).

Method 500 may proceed to operation 504, which represents measuring one period of ground connection voltage. For example, the grounding cable warning software may cause the grounding cable warning device to measure one period of ground connection voltage. One period may be calculated based at least in part on a power system of a country. For example, in the power system of the United States operates at 60 Hz and one period is calculated as 1/60 of a second or 16.66 mS.

Method 500 may include operation 506, which represents measuring one period of ambient voltage. For example, the grounding cable warning software may cause the grounding cable warning device to measure one period of ambient voltage.

Method 500 may include operation 508, which represents measuring one period of ground connection current. For example, the grounding cable warning software may cause the grounding cable warning device to measure one period of ground connection current.

Method 500 may include operation 510, which represents measuring one period of ambient current. For example, the grounding cable warning software may cause the grounding cable warning device to measure one period of ambient current.

Method 500 may include operation 512, which represents calculating an impedance of the grounding connection. For example, the grounding cable warning software may cause the grounding cable warning device to calculate a ground connection impedance. Operation 512 may also represent the grounding cable warning software causing the grounding cable warning device to calculate the voltage and/or electrical current present on the ground conductor. Operation 512 may further represent the grounding cable warning software causing the grounding cable warning device to calculate the voltage and/or electrical current present in electrical systems proximate to the grounding cable warning device.

Method 500 may include operation 514, which represents logging and/or transmitting data associated with the measured ground connection voltage, ambient voltage, ground connection current, ambient current, and or calculated ground connection impedance. For example, the grounding cable warning software may cause the grounding cable warning device to log and/or transmit the data associated with the measured ground connection voltage, ambient voltage, ground connection current, ambient current, and or calculated ground connection impedance. The grounding cable warning software may cause the grounding cable warning device to transmit the data wirelessly to a user.

Method 500 may include operation 516, which represents determining if a hazard is detected. For example, the grounding cable warning software may analyze the data associated with the measured ground connection voltage, ambient voltage, ground connection current, ambient current, and or calculated ground connection impedance to determine if measured data represents a hazardous condition.

If a hazard is detected, then method 500 may proceed to operation 518, which represents issuing one or more alerts.

For example, if a hazard is detected, then the grounding cable warning software may cause the grounding cable warning device to issue one or more alerts including, but not limited to: one or more visual alerts to a user, one or more audible alerts to a user, and/or one or more wireless alerts to a user.

If a hazard is not detected, then method 500 may proceed to operation 520, which represents the grounding cable warning device entering a low-power idle state. For example, if a hazard is not detected, then the grounding cable warning software may cause the grounding cable warning device to enter a low-power idle state for a period of time ($T_{idle}$).

Specifics of exemplary safety warning methods 400 and 500 are described above. However, it should be understood that certain acts in the methods 400, 500 need not be performed in the order described, may be modified, combined, and/or may be omitted entirely, depending on the circumstances. For example, in method 500, the act of logging and/or transmitting data may be omitted. Moreover, acts from one method may be combined with acts from another method in a variety of combinations.

Also, any of the acts described above with respect to the methods 400 and 500 may be implemented by a processor or other computing device based on instructions stored on one or more computer-readable media associated with a grounding cable warning device.

Conclusion

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter.

What is claimed is:

1. A grounding cable warning device for a grounding cable, comprising:
   a housing affixable to the grounding cable;
   an electrical current transformer disposed within the housing;
   an energy storage component disposed within the housing;
   a first sensor disposed within the housing and configured to detect an electrical current in the grounding cable;
   a second sensor disposed within the housing and configured to detect a voltage of the grounding cable;
   one or more electronic indication components disposed with the housing and configured to alert a user of an unsafe condition; and
   a microcontroller disposed within the housing and configured to:
   receive, from the first sensor, a first input indicating an electrical current value,
   receive, from the second sensor, a second input indicating a voltage value,
   calculate an impedance value of a connection between the grounding cable and a grounding member, the impedance value based at least in part on the electrical current value and the voltage value,
   determine whether the impedance value is above a threshold impedance value, and
   actuate the one or more electronic indication components to alert the user of the unsafe condition.

2. The grounding cable warning device according to claim 1, wherein the electrical current transformer includes a power-harvesting split-core electrical current transformer.

3. The grounding cable warning device according to claim 2, wherein the power-harvesting split-core electrical current transformer charges the energy storage component.

4. The grounding cable warning device according to claim 1, wherein the energy storage component includes a lithium-ion polymer battery or a super capacitor.

5. The grounding cable warning device according to claim 1, wherein the first sensor includes a magneto-resistive integrated circuit (IC).

6. The grounding cable warning device according to claim 1, wherein the second sensor includes an electric field sensor.

7. The grounding cable warning device according to claim 6, wherein the electric field sensor includes:
   a capacitively-coupled PCB parallel-plate antenna and accompanying pico-ampere current measurement circuit,
   a tri-parallel-plate capacitive electric field antenna, or
   a capacitively-coupled PCB pad array antenna.

8. The grounding cable warning device according to claim 1, wherein the one or more electronic indication components includes:
   one or more light sources disposed with the housing to produce a visual alert of the unsafe condition,
   one or more speakers disposed with the housing to produce an audible alert of the unsafe condition, or
   one or more wireless communications devices disposed with the housing to broadcast digital information of an unsafe condition.

9. The grounding cable warning device according to claim 1, wherein the one or more electronic indication components includes an antenna disposed within the housing,
   wherein the antenna is configured to produce a signal, and
   wherein the signal provides feedback to workers via at least one of:
      a numerical display,
      a remote display device connected via a wireless communication path,
      first information delivered to a cloud application,
      second information delivered to connected computers, or
      third information delivered to mobile communication devices.

10. A grounding cable warning system for use with a grounding cable having a connection with a grounding member, comprising:
   a grounding cable warning device affixed to the grounding cable, the grounding cable warning device including:
      a housing,
      an electrical current transformer disposed within the housing,
      an energy storage component disposed within the housing,
      a first sensor disposed within the housing and configured to detect an electrical current in the grounding cable,
      a second sensor disposed within the housing and configured to detect a voltage of the grounding cable,
      one or more electronic indication components disposed with the housing and configured to alert a user of an unsafe condition, and
      a microcontroller disposed within the housing and configured to:
         receive, from the first sensor, a first input indicating an electrical current value,
         receive, from the second sensor, a second input indicating a voltage value,
         calculate an impedance value of a connection between the grounding cable and a grounding member, the impedance value based at least in part on the electrical current value and the voltage value,
         determine whether the impedance value is above a threshold impedance value, and
         actuate the one or more electronic indication components to alert the user of the unsafe condition.

11. The grounding cable warning system according to claim 10, wherein the electrical current transformer includes a power-harvesting split-core electrical current transformer.

12. The grounding cable warning system according to claim 11, wherein the power-harvesting split-core electrical current transformer charges the energy storage component.

13. The grounding cable warning system according to claim 10, wherein the energy storage component includes a lithium-ion polymer battery or a super capacitor.

14. The grounding cable warning system according to claim 10, wherein the first sensor includes a magneto-resistive integrated circuit (IC).

15. The grounding cable warning system according to claim 10, wherein the second sensor comprises an electric field sensor.

16. The grounding cable warning system according to claim 15, wherein the electric field sensor includes:
   a capacitively-coupled PCB parallel-plate antenna,
   a tri-parallel-plate capacitive electric field antenna, or
   a capacitively-coupled PCB pad array antenna.

17. The grounding cable warning system according to claim 10, wherein the one or more electronic indication components includes an antenna disposed within the housing,
   wherein the antenna is configured to produce a signal, and
   wherein the signal provides feedback to workers via at least one of:
      a numerical display,
      a remote display device connected via a wireless communication path,
      first information delivered to a cloud application,
      second information delivered to connected computers, or
      third information delivered to mobile communication devices.

18. A method of providing a safety warning using a grounding cable warning device affixed to a grounding cable, the method comprising:
   receiving, by an electrical current transformer disposed within a housing of the grounding cable warning device, an electrical current of the grounding cable;
   detecting, by a first sensor disposed within the housing, the electrical current of the grounding cable;
   detecting, by a second sensor disposed within the housing, a voltage of the grounding cable;
   receiving, by a microcontroller disposed within the housing and from the first sensor, a first input indicating an electrical current value of the electrical current;
   receiving, by the microcontroller and from the second sensor, a second input indicating a voltage value of the voltage;
   calculating, by the microcontroller, an impedance value of a connection between the grounding cable and a grounding member, the impedance value based at least in part on the electrical current value and the voltage value;
   determining, by the microcontroller, the impedance value is above a threshold impedance value; and actuating, by the microcontroller, one or more electronic indication components to alert a user of an unsafe condition.

19. The method according to claim 18, further comprising:

charging, by the electrical current transformer, an energy storage component disposed within the housing.

20. The method according to claim 18, wherein the one or more electronic indication components includes:

a light source disposed with the housing to produce a visual alert of the unsafe condition, a speaker disposed with the housing to produce an audible alert of the unsafe condition, or an antenna disposed with the housing to produce a signal of the unsafe condition.

\* \* \* \* \*